United States Patent
Larussi et al.

(10) Patent No.: US 10,305,193 B1
(45) Date of Patent: May 28, 2019

(54) WIDE-BAND HIGH SPEED COMMUNICATIONS CHANNEL FOR CRYOGENIC APPLICATIONS

(71) Applicant: RAYTHEON COMPANY, Waltham, MA (US)

(72) Inventors: Amedeo Larussi, Waltham, MA (US); David A. Buell, Waltham, MA (US); Craig R. Adams, Waltham, MA (US); Christopher Moshenrose, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/902,396

(22) Filed: Feb. 22, 2018

(51) Int. Cl.
| | |
|---|---|
| *H01L 23/34* | (2006.01) |
| *H01L 23/367* | (2006.01) |
| *H01Q 13/20* | (2006.01) |
| *H01L 23/66* | (2006.01) |
| *H01P 5/02* | (2006.01) |
| *H01P 1/04* | (2006.01) |

(52) U.S. Cl.
CPC .......... *H01Q 13/206* (2013.01); *H01L 23/66* (2013.01); *H01P 1/047* (2013.01); *H01P 5/028* (2013.01); *H01L 2223/6627* (2013.01)

(58) Field of Classification Search
CPC . H01L 2224/73265; H01L 2224/16225; H01L 2223/6677; H01L 2924/3025; H01L 2924/1421; H01L 5/026; H01L 23/66; H01L 2223/6627; H01P 1/047; H01Q 13/206
See application file for complete search history.

(56) References Cited

U.S. PATENT DOCUMENTS

| | | | |
|---|---|---|---|
| 5,010,304 A | 4/1991 | Mueller et al. | |
| 5,482,477 A | 1/1996 | Michael | |
| 6,190,206 B1 | 2/2001 | Yang | |
| 7,145,411 B1 * | 12/2006 | Blair | H01P 3/006 333/5 |

(Continued)

FOREIGN PATENT DOCUMENTS

WO    94/18715 A1    8/1994

OTHER PUBLICATIONS

David B. Tuckerman, et al.; "Flexible superconducting Nb transmission lines on thin film polyimide for quantum computing applications;" Superconductor Science and Technology; 2016; 12 pages.

(Continued)

*Primary Examiner* — Caridad Everhart
(74) *Attorney, Agent, or Firm* — Burns & Levinson, LLP; Joseph M. Maraia

(57) ABSTRACT

A high speed radio frequency signal interconnect device provides for signal communication within a system at cryogenic temperatures. The device includes a plurality of conductive traces provided on a first dielectric substrate where the ends of the traces have a predetermined shape. A second dielectric substrate covers the first dielectric substrate leaving the ends of the traces exposed. A connector is coupled to each respective end and includes pins coupled to a respective trace. Each connector is configured to define a respective isolating chamber about each of the first ends of the conductive traces where the pins are attached.

20 Claims, 23 Drawing Sheets

(56) References Cited

U.S. PATENT DOCUMENTS

| | | |
|---|---|---|
| 7,311,552 B1 | 12/2007 | Ko |
| 7,889,021 B2 | 2/2011 | Maiuzzo |
| 9,093,442 B1* | 7/2015 | Huynh .................. H01L 23/473 |
| 2007/0181337 A1 | 8/2007 | Miller |
| 2013/0002376 A1* | 1/2013 | Ihla .......................... H01P 1/047 |
| | | 333/24 R |
| 2015/0318597 A1* | 11/2015 | Park ..................... H05K 1/0242 |
| | | 333/26 |
| 2018/0115074 A1* | 4/2018 | Wargo ...................... H01Q 1/24 |

OTHER PUBLICATIONS

Vaibhav Gupta, et al.; "Minimizing Film Stress and Degradation in Thin-film Nb Superconducting Cables;" Department of Electrical and Computer Engineering, Auburn University; Jan. 2017; 3 pages.

Simin Zou, et al.; "Influence of Fatigue and Bending Strain on Critical Currents of Niobium Superconducting Flexible Cables Containing Ti and Cu Interfacial Layers;" IEEE Transactions on Applied Superconductivity, vol. 27. No. 4; Jun. 2017; 5 pages.

George A. Hernandez, et al.; "Microwave Performance of Niobium/Kapton Superconducting Flexible Cables;" IEEE Transactions on Applied Superconductivity, vol. 27. No. 4; Jun. 2017; 4 pages.

Goddard Space Flight Center, Greenbelt, Maryland; "Flexible Microstrip Circuits for Superconducting Electronics;" NASA Tech Briefs; Dec. 2013; 2 pages.

International Search Report and Written Opinion from related PCT Application No. PCT/US2018/049183 dated Dec. 13, 2018.

Harris, et al., "Note: Cryogenic Microstripline-on-Kapton Microwave Interconnects," Review of Scientific Instruments, AIP, vol. 83, No. 8, Jun. 7, 2012, retrieved on Aug. 3, 2012.

Walter, et al., "Laminated NbTi-on-Kapton Microstrip Cables for Flexible Sub-Kelvin RF Electronics," IEEE Transactions on Applied Superconductivity, vol. 28, No. 1, Dec. 15, 2017, pp. 1-5.

* cited by examiner

WIDE-BAND HIGH SPEED COMMUNICATIONS CHANNEL FOR CRYOGENIC APPLICATIONS

GOVERNMENT FUNDING

This invention was made with Government support. The Government has certain rights in the invention.

BACKGROUND

In 2012, NASA sponsored research and design efforts related to an RF (Radio Frequency) channel using a microstrip (SMA launching excitation) with a perforated ground plane for a cryogenic application. Teams from various Universities and NASA participated in this research, design and prototype effort. A device was eventually designed and was able to achieve isolation levels of about 30 dB over a relatively narrow frequency range and perform at temperatures of 297 K and 77 K.

What is needed is an RF transmission structure for cryogenic applications with a larger frequency band of operation, a better impedance match and improved channel-to-channel isolation.

SUMMARY

According to one aspect of the disclosure, an RF signal interconnect device comprises a first dielectric substrate having a first surface and a second surface and first and second ends; a plurality of conductive traces provided on the first surface of the first dielectric substrate, each trace having first and second ends, wherein each of the first and second ends has a predetermined shape; a second dielectric substrate disposed on the first surface of the first dielectric substrate, the second dielectric substrate having first and second ends respectively aligned with the first and second ends of the first substrate, wherein the second dielectric substrate is configured so as not to cover the first and second ends of the conductive traces, whereby the first and second ends of the traces are exposed; a first connector coupled to the first ends of the first and second dielectric substrates; a first plurality of conductive pin assemblies disposed in the first connector, each conductive pin assembly coupled to a respective first end of a conductive trace where the conductive trace is not covered by the second dielectric substrate, wherein the first connector is configured to define a respective isolating chamber about each of the first ends of the conductive traces.

In another aspect of the present disclosure, an RF signal interconnect device comprises a signal carrying structure. The signal carrying structure comprises a first dielectric substrate having a first surface and a second surface; a plurality of conductive traces provided on the first surface of the first dielectric substrate, each trace having first and second ends, wherein each of the first and second ends has a predetermined shape; and a second dielectric substrate disposed on the first surface of the first dielectric substrate, wherein the second dielectric substrate is configured so as not to cover the first and second ends of the conductive traces, whereby the first and second ends of the traces are exposed. In addition; a first connector, coupled to the signal carrying structure, comprises an upper shell portion; a plurality of dividing walls provided in the upper shell portion and defining a plurality of cavities; and a first plurality of conductive pin assemblies, each pin assembly arranged in a respective upper shell portion cavity and coupled to a respective first end of a conductive trace where the conductive trace remains exposed through the second dielectric substrate, whereby a respective isolating chamber about the first ends of the conductive traces is provided.

BRIEF DESCRIPTION OF THE DRAWINGS

Various aspects of the disclosure are discussed below with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures:

FIG. 10-1 is a top view of the close-up view of the end of the second dielectric substrate disposed over the first dielectric substrate in accordance with an aspect of the present disclosure;

FIG. 10-2 is a close-up view of the end of the second dielectric substrate of FIG. 10-1;

FIG. 12-1 is a perspective view of a connector in accordance with an aspect of the present disclosure;

FIG. 12-2 is a perspective view of a connector in accordance with an aspect of the present disclosure FIG. 13-1 is a perspective view of a pin assembly in accordance with an aspect of the present disclosure;

FIG. 13-2 is a perspective view of a pin assembly in accordance with an aspect of the present disclosure;

DETAILED DESCRIPTION

Figure 1:
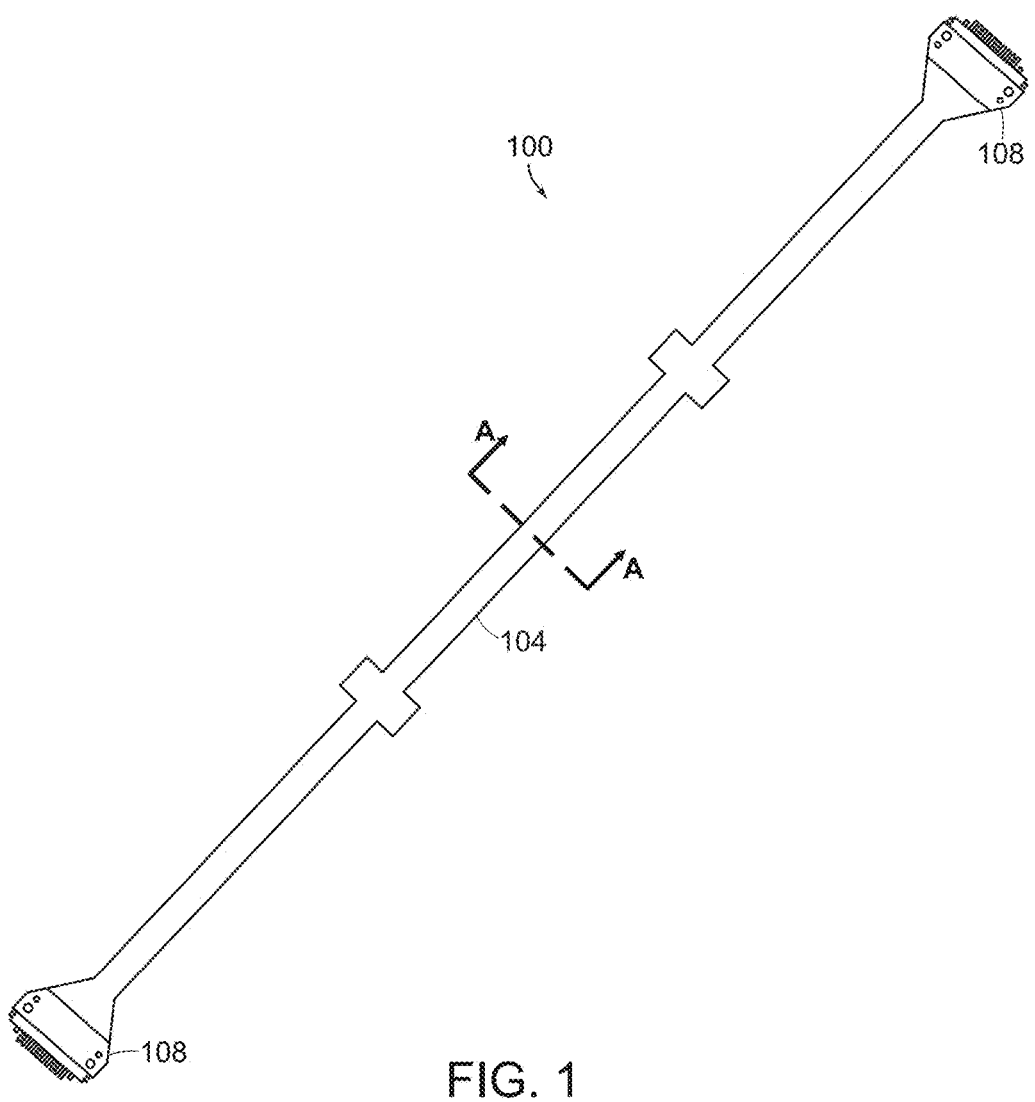
FIG. 1 is a top view of an RF signal interconnect device in accordance with an aspect of the present disclosure.

In the following description, details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

It is to be understood that the disclosure is not limited in its application to the details of construction and the arrangement of the components set forth in the following description or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

It should be noted that, where used, "top," "bottom," "upper," "lower," etc., are merely for explaining the relative placement of components described herein. These relative placement descriptions are not meant to limit the claims with respect to a direction of gravity or a horizon.

Generally, and as will be described in more detail below, aspects of the present disclosure provide an RF signal interconnect device that provides for RF high speed signal communication within a system at cryogenic temperatures. The device is sized to fit within small packaging requirements, e.g., a 101.6 µm vertical stack. Further, the device is flexible to allow for bending during operation and operates over an ultra-wide frequency band with return loss and isolation between channels that exceeds that which had been previously demonstrated. Advantageously, the device is structured to convert, from a connector on one end to a connector on the other end, from a coaxial TEM (Transverse Electromagnetic) mode of transmission to a microstrip mode, to a hybrid mode, and to a strip-line mode, sequentially. A transitional cavity between the coaxial and microstrip structures serves to minimize unwanted high order mode excitations. Further, combinatory signals, i.e., received and transmitted signals or bi-directional signals, are supported.

In addition, as will be described, the device uses flexible polyimide dielectric materials, for example, Kapton® polyimide available from DuPont, to fabricate the ultra-wide frequency band RF signal interconnect device for a cryogenic application. In one use, the interconnect device is deployed within a communication system to provide a plurality of RF combinatory signals for transmission and reception prioritization. In one non-limiting example, a primary frequency band of operation, impedance match and isolation of interest was established to be DC to 10 GHz, nominally 4 to 9 GHz, −15 dB, and 50 dB, respectively. For operation at very low cryogenic temperatures of about 4 K, the device is implemented with Niobium conductors.

Referring now to FIG. 1, an RF signal interconnect device 100 is shown and comprises an elongated multi-layer signal carrying structure 104. A connector 108 is provided at each end of the signal carrying structure 104. In one non-limiting example, the device 100 may be about 18 inches in length.

Figure 2:
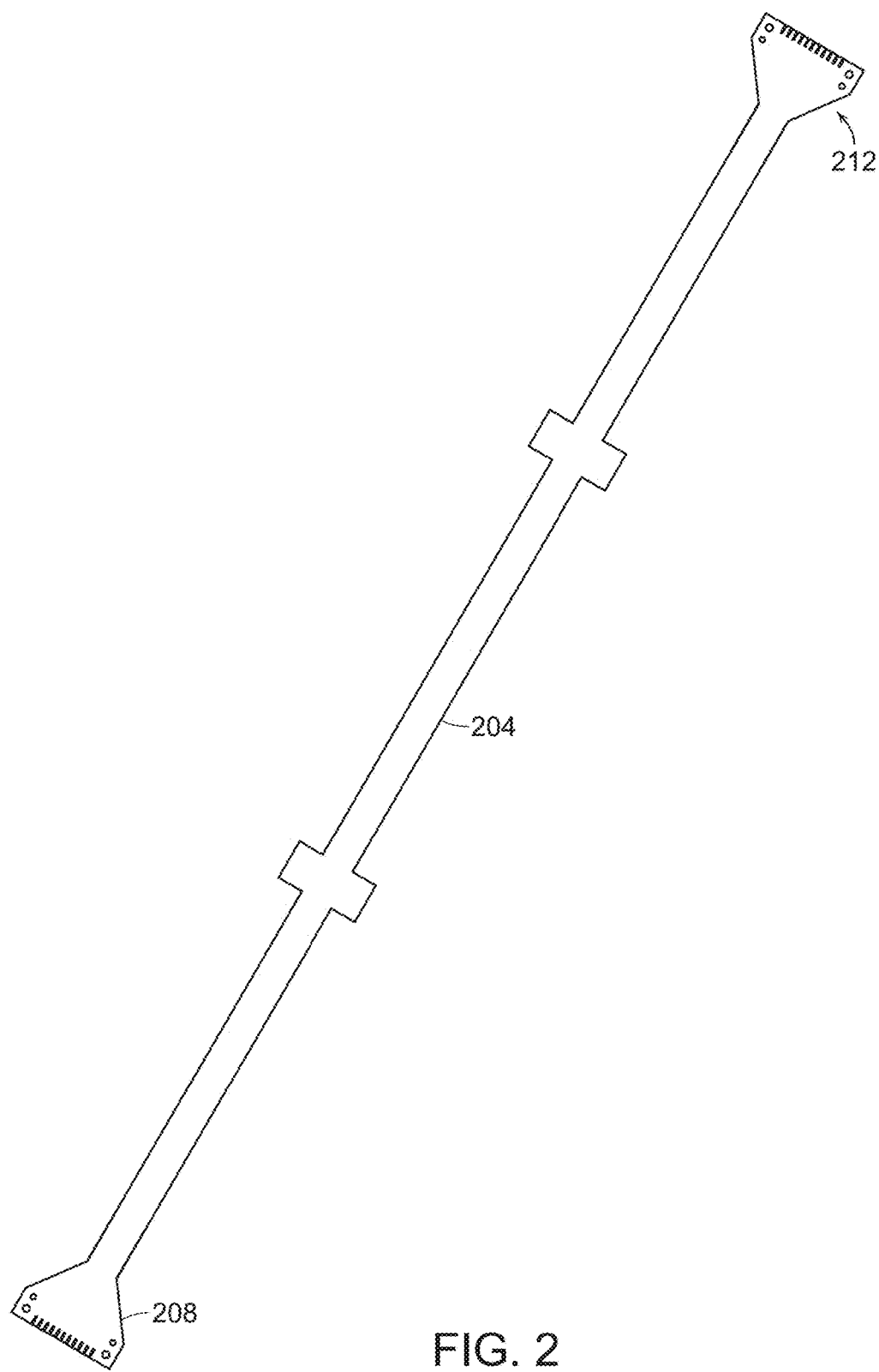
FIG. 2 is a top view of a first dielectric substrate in accordance with an aspect of the present disclosure.
Figure 3:
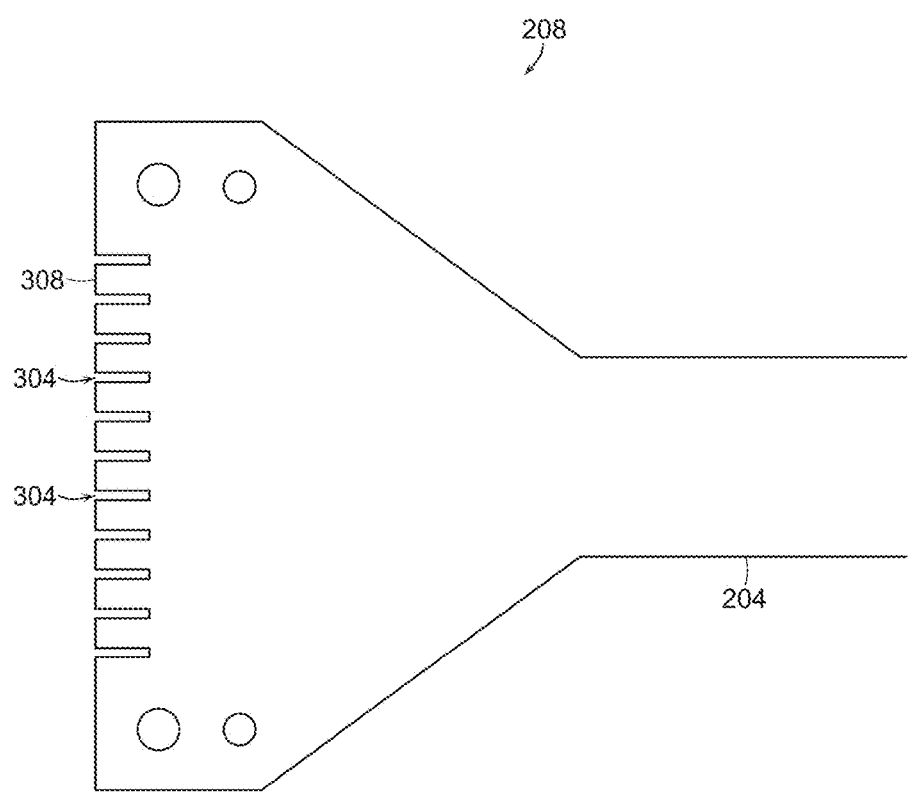
FIG. 3 is a close-up view of an end of the first dielectric substrate shown in FIG. 2.

The signal carrying structure 104 includes a first dielectric substrate 204 as shown in FIG. 2. The first dielectric substrate 204 includes a first end 208 and a second end 212. The first dielectric substrate 204 may be made from Kapton EN200 or Kapton HN500 with respective thicknesses of 0.002 inches (in) in for operation at very low temperatures, that is, in cryogenic or superconducting conditions. Alternately, the first dielectric substrate 204 may be made from Kapton Pyralix AP if not operating at superconducting temperatures. The first end 208 and second end 212 have the same configuration, as shown in FIG. 3.

The first and second ends 208, 212 of the first dielectric substrate 204 include a plurality of slots 304 that are defined in each respective end. Each pair of adjacent slots 304 further defines a trace tab 308 which will be described below.

Figure 4:
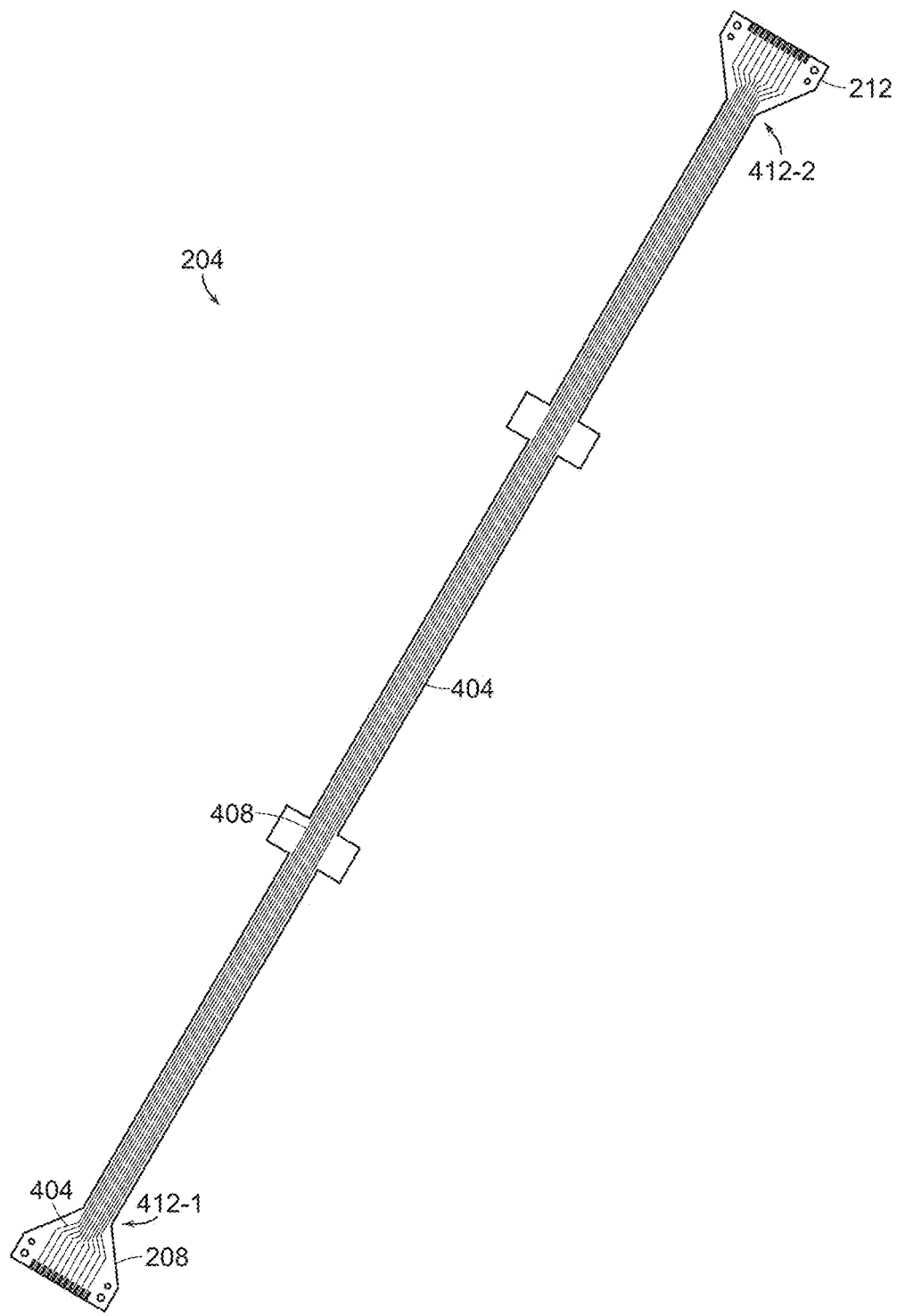
FIG. 4 is a top view of the first dielectric substrate including conductive traces in accordance with an aspect of the present disclosure.

A plurality of conductive traces 404 are provided on a first surface 408 of the first dielectric substrate 204 as shown in FIG. 4. These traces 404 are provided to run from the first end 208 to the second end 212. The traces 404 may include one or more of Niobium, Niobium-Titanium Alloy, Niobium-Germanium Alloy, Niobium-Tin Alloy, Tantalum or Magnesium Diboride for operation at superconducting temperatures. For operation at non-superconducting temperatures, the traces 404 may include Copper or Aluminum.

The traces 404 may be provided on the first surface 408 by any one of known deposition processes including, for example, silk-screening and sputtering.

Figure 5:
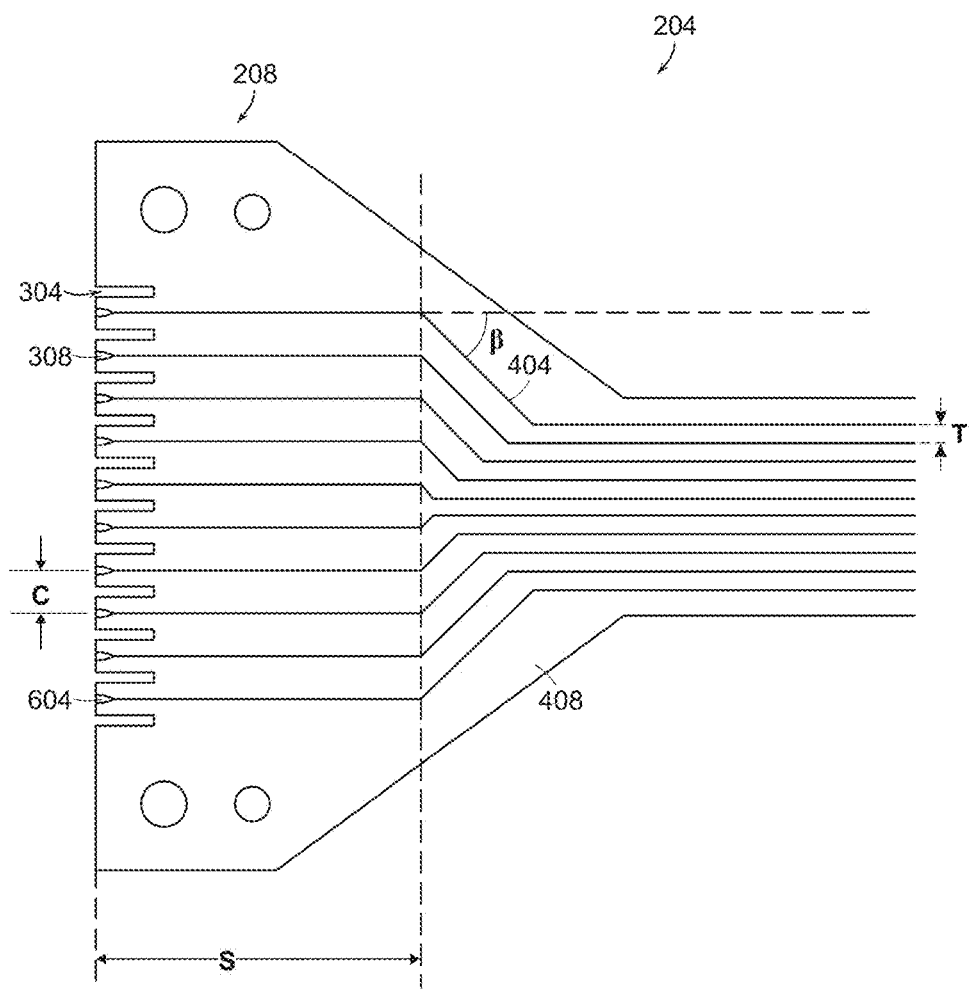
FIG. 5 is a close-up view of an end of the first dielectric substrate including conductive traces in accordance with an aspect of the present disclosure.

As shown in FIG. 5, the traces 404 are provided on the first dielectric substrate 204 to run from a trace tab 308 at the first end 208 to a respective trace tab 308 at the second end 212. Each trace 404 is positioned at a center of its respective trace tab 308 as shown in close up in FIG. 6 and spaced a distance C of 0.0800±0.0004 in.

Figure 6:
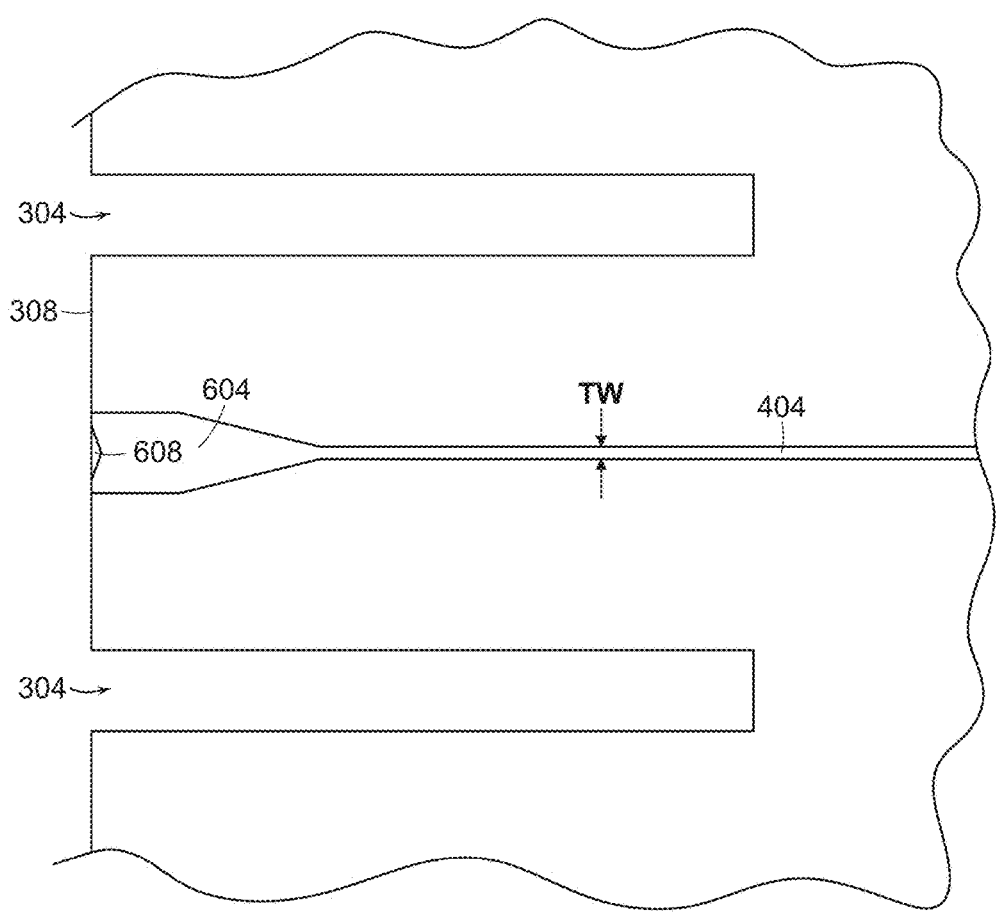
FIG. 6 is a further close-up view of an end of the first dielectric substrate including a conductive trace in accordance with an aspect of the present disclosure.

Generally, each trace 404 has a constant width TW along most of its length, excluding a trace launch portion 604 as depicted in FIG. 6. The width TW may be from 0.002 in to 0.006 in, with implementations of 0.002 in for superconducting implementations and 0.004 in for non-superconducting configurations. Each end of the trace 404 expands into the trace launch portion 604. The trace launch portion 604 is centered on the trace tab 308.

Figure 7:
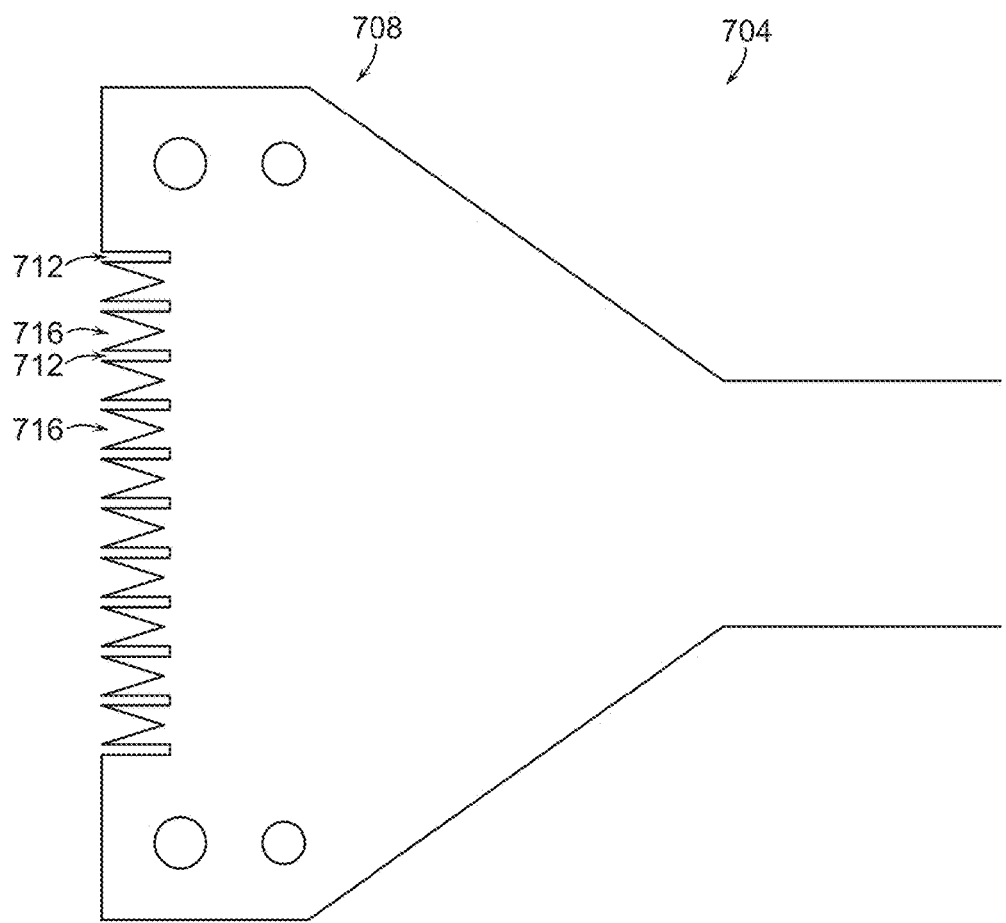
FIG. 7 is a close-up view of an end of a second dielectric substrate in accordance with an aspect of the present disclosure.

The signal carrying structure 104 includes a second dielectric substrate 704 that generally has a same length and shape as the first dielectric substrate 204. The second dielectric substrate 704 may be made from Kapton EN200 or Kapton HN500 with respective thicknesses of 0.002 in and 0.005 in for operation at very low temperatures, that is, in cryogenic or superconducting conditions. Alternately, the second dielectric substrate 704 may be made from Kapton Pyralix AP if not operating at superconducting temperatures. The ends 708, however, of the second dielectric substrate 704 are not configured in the same manner as the ends 208, 212 of the first dielectric substrate 204 as is shown in FIG. 7.

Each end 708 includes a plurality of slots 712 that are positioned to align with the slots 304 of the first dielectric substrate 204 when the second dielectric substrate 704 is placed upon it. A generally V-shaped, or triangular, notch 716 is defined between each slot 712 and positioned to align with a respective trace tab 308 of the first dielectric substrate 204.

Figure 8:
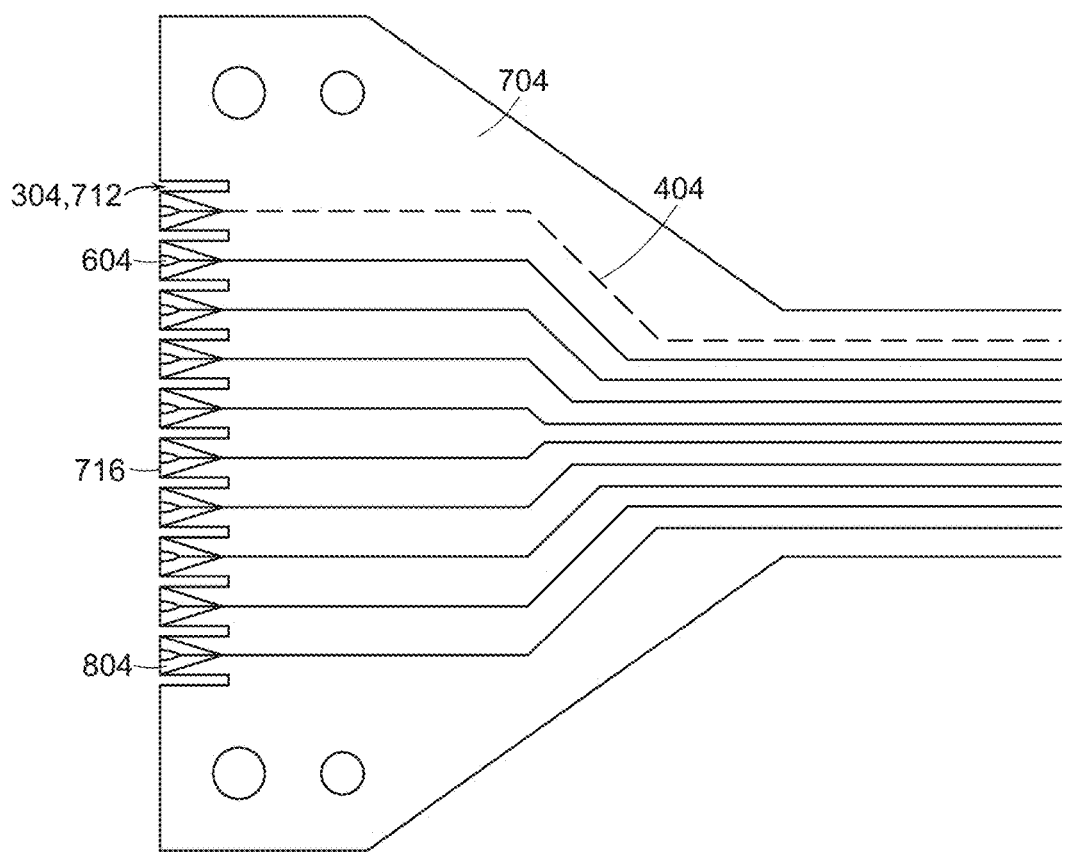
FIG. 8 is a close-up view of the end of the second dielectric substrate disposed over the first dielectric substrate in accordance with an aspect of the present disclosure.

As part of a stack of components of the signal carrying structure 104, the second dielectric substrate 704 is positioned over the first dielectric substrate 204, as is shown in FIG. 8. In one aspect of the present disclosure, a layer of an adhesive is provided between the first and second dielectric substrates 204, 704. The layer of adhesive may comprise an acrylic adhesive and may have a thickness, for example, in the range of 0.0003 to 0.0007 in, nominally 0.0005 in.

Figure 9:
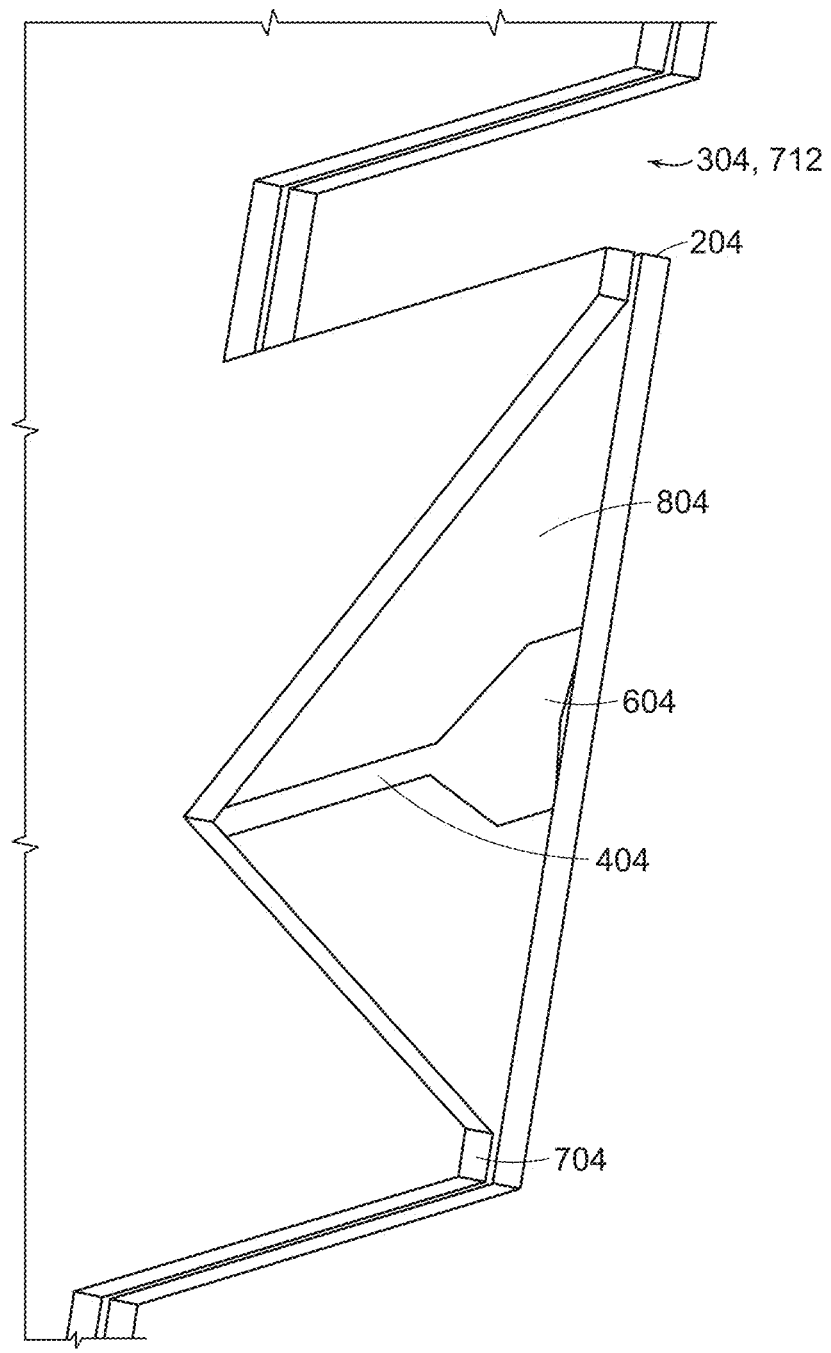
FIG. 9 is a further close-up perspective view of the end of the second dielectric substrate disposed over the first dielectric substrate in accordance with an aspect of the present disclosure.
Figures 2, 10:
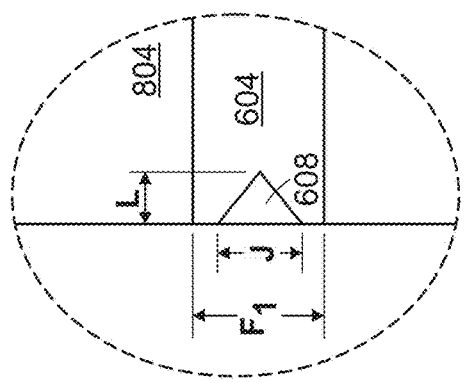
Figures 1, 10:
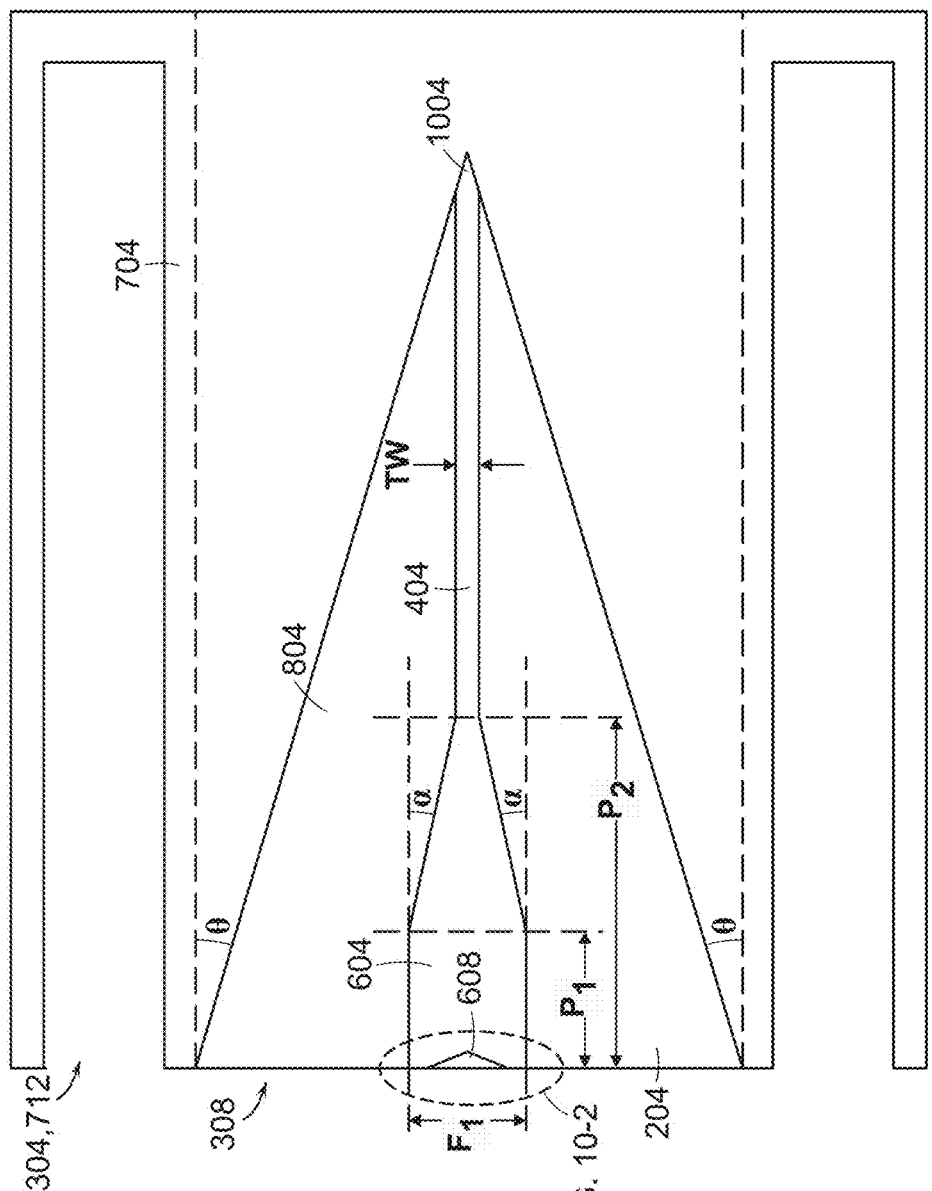

The arrangement of the ends 708 of the second dielectric substrate 704 over the respective ends of the first dielectric substrate 204 creates an opening 804 where a portion of the first surface of the first dielectric substrate 204 remains exposed, as shown in FIGS. 8, 9 and 10. The arrangement of the opening 804 and the respective connector 108 will be discussed further below.

Figure 21:
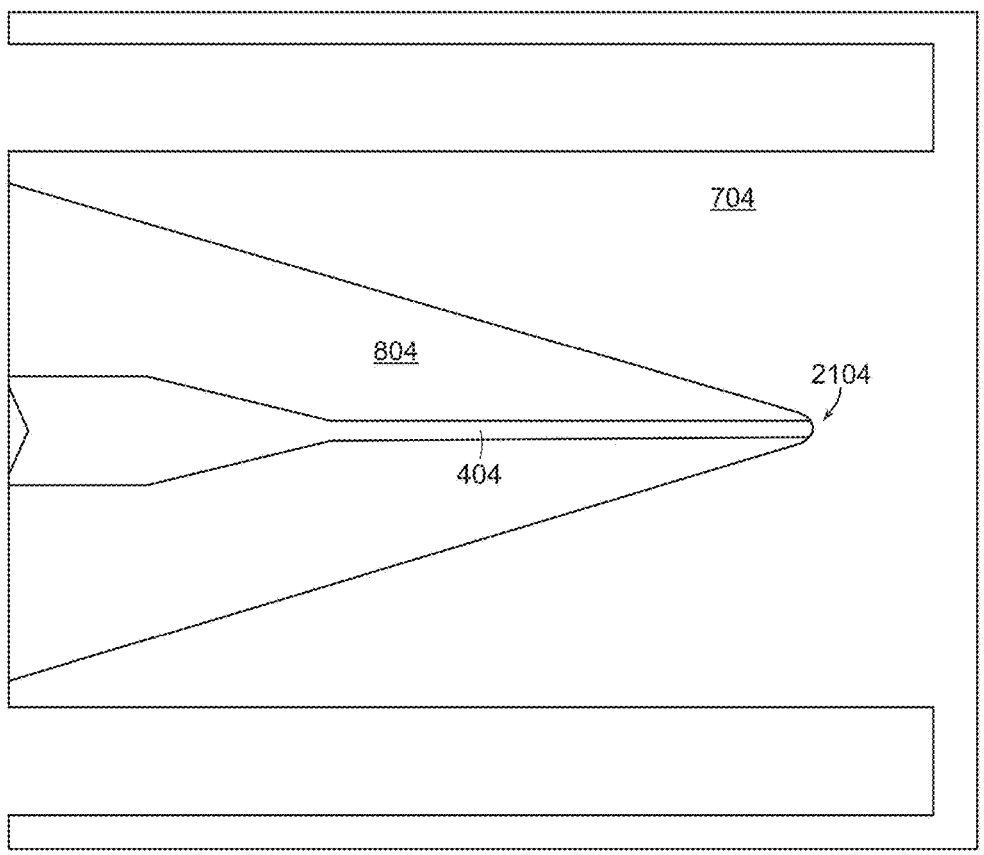
FIG. 21 is a top view of the close-up view of the end of the second dielectric substrate disposed over the first dielectric substrate in accordance with an aspect of the present disclosure.

Referring now to FIG. 10-1, the opening 804 is generally triangular and includes an apex 1004 where the trace 404 travels under the second dielectric substrate 704. The apex 1004, in one aspect of the present disclosure, comes to a point, as shown in FIG. 10-1. Alternately, referring now to FIG. 21, the opening 804 may comprise an apex 2014 that is a rounded portion with a radius of, for example, 0.005 in. An angle θ, with respect to the slots 304, 712 may be in the range of 16.3° to 17.1°, nominally 16.7°. As shown in FIG. 10-1, the opening 804 extends almost the same length as the slots 304, 712.

The trace launch 604 starting from the end of the device 100 i.e., left-to-right in FIG. 10-1, has an initial width $F_1$ of 0.013±0.001 in for a length $P_1$ of 0.0156±0.0005 in and then transitions, with a slope or angle α, out to a distance $P_2$ of 0.383±0.0005 in from the edge, down to the trace width TW. The angle α may be in the range of 10.9° to 15.6°, nominally 13.1°.

A terminal end of the trace launch 604 has a triangular notch 608 defined therein that exposes the first dielectric substrate 204 underneath. The notch 608 has a width J of 0.010±0.001 in and a height L of 0.0018±0.0005 in, as shown in FIG. 10-2.

Figure 11:
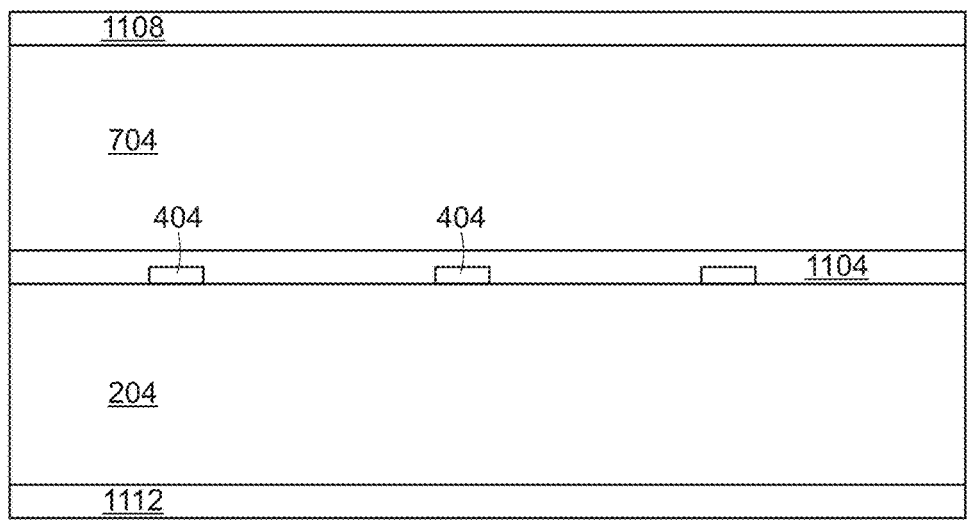
FIG. 11 is a cross-sectional view along line A-A, shown in FIG. 1.

A cross-section of the "stack-up" of the signal carrying structure 104 along line A-A, shown in FIG. 1, is presented in FIG. 11. Thus, the first dielectric substrate 204 and conductive traces 404 have an adhesive layer 1104 provided to maintain the second dielectric substrate 704 in place. In addition, a first protective layer (shield) 1108 is provided over the second dielectric substrate 704 and a second protective layer (shield) 1112 is coupled to the other surface of the first dielectric substrate 204. The first and second protective layers 1108, 1112 may be made of Niobium film with a thickness of 1 μm for cryogenic operations or copper foil of a thickness of 8.5 μm for non-superconducting operation.

In one non-limiting method of manufacturing the signal carrying structure 104, the lower shield 1112 and a layer of conducting material are deposited on the first dielectric substrate 204. The conducting material is then etched, resulting in the conductors 404. The second dielectric substrate 704 is provided with the first protective layer 1108 when the waveguide features are created and is then laminated to the first dielectric substrate 204. Subsequently, the shape of the cable is created after lamination by a cutting operation.

Figures 1, 12:
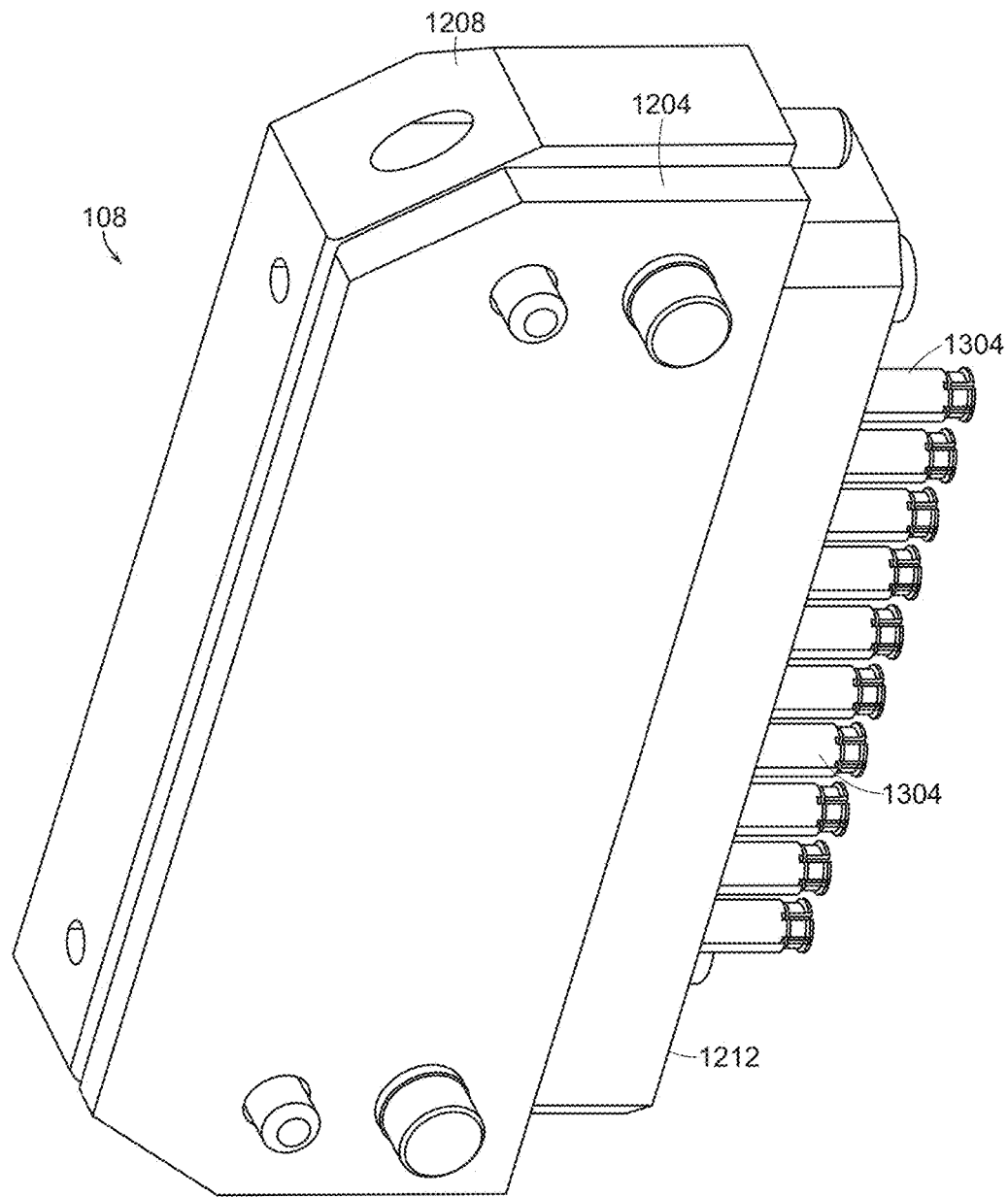
Figures 2, 12:
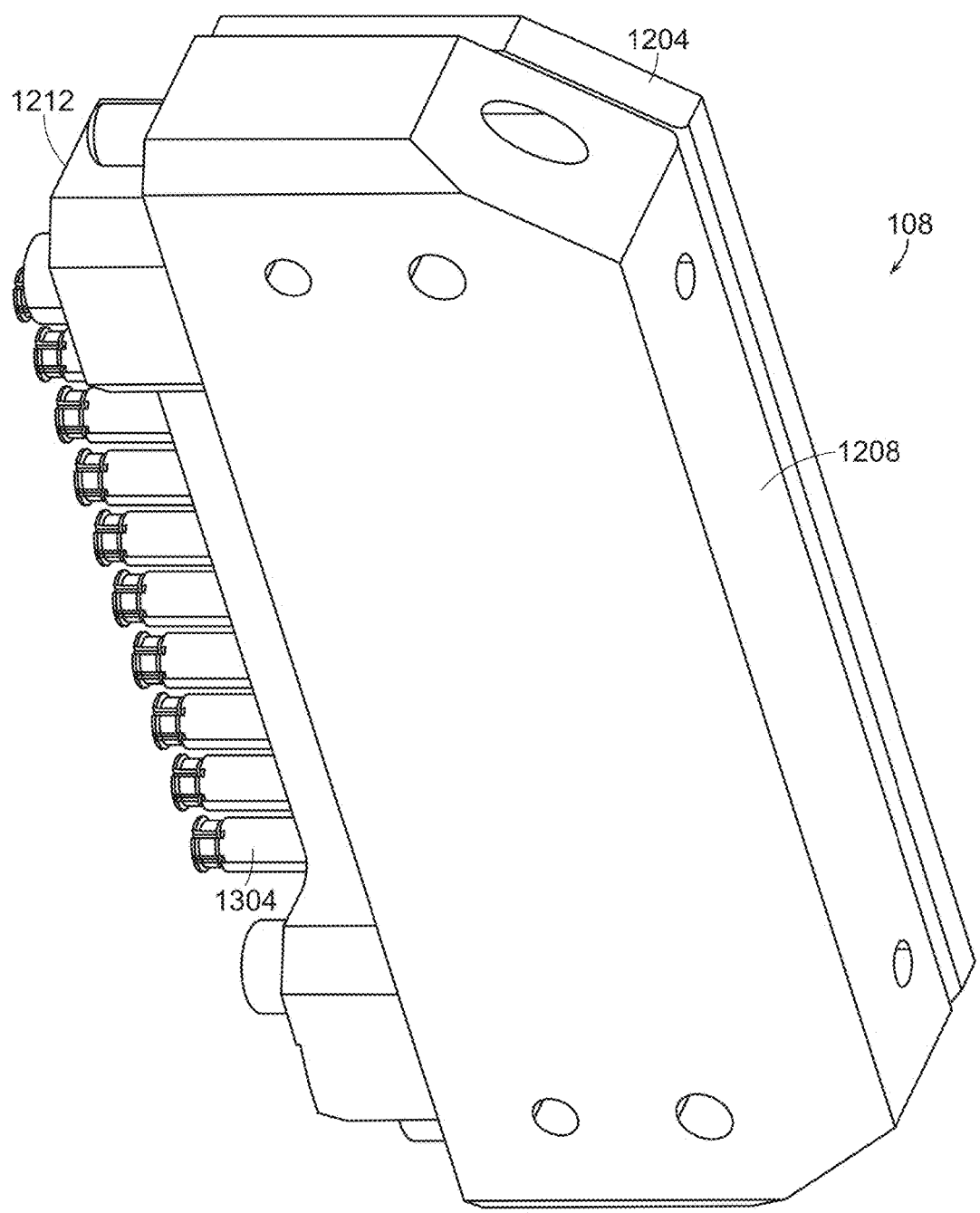

The two end connectors 108 are the same and include an upper shell 1204 and a lower shell 1208 as shown in FIGS. 12-1 and 12-2. The upper and lower shells 1204, 1208 are configured to clamp around the ends of the signal carrying structure 104. A receptacle 1212 is coupled to the upper and lower shells 1204, 1208 to hold a plurality of coaxial pin assemblies 1304 in place.

Figures 1, 13:
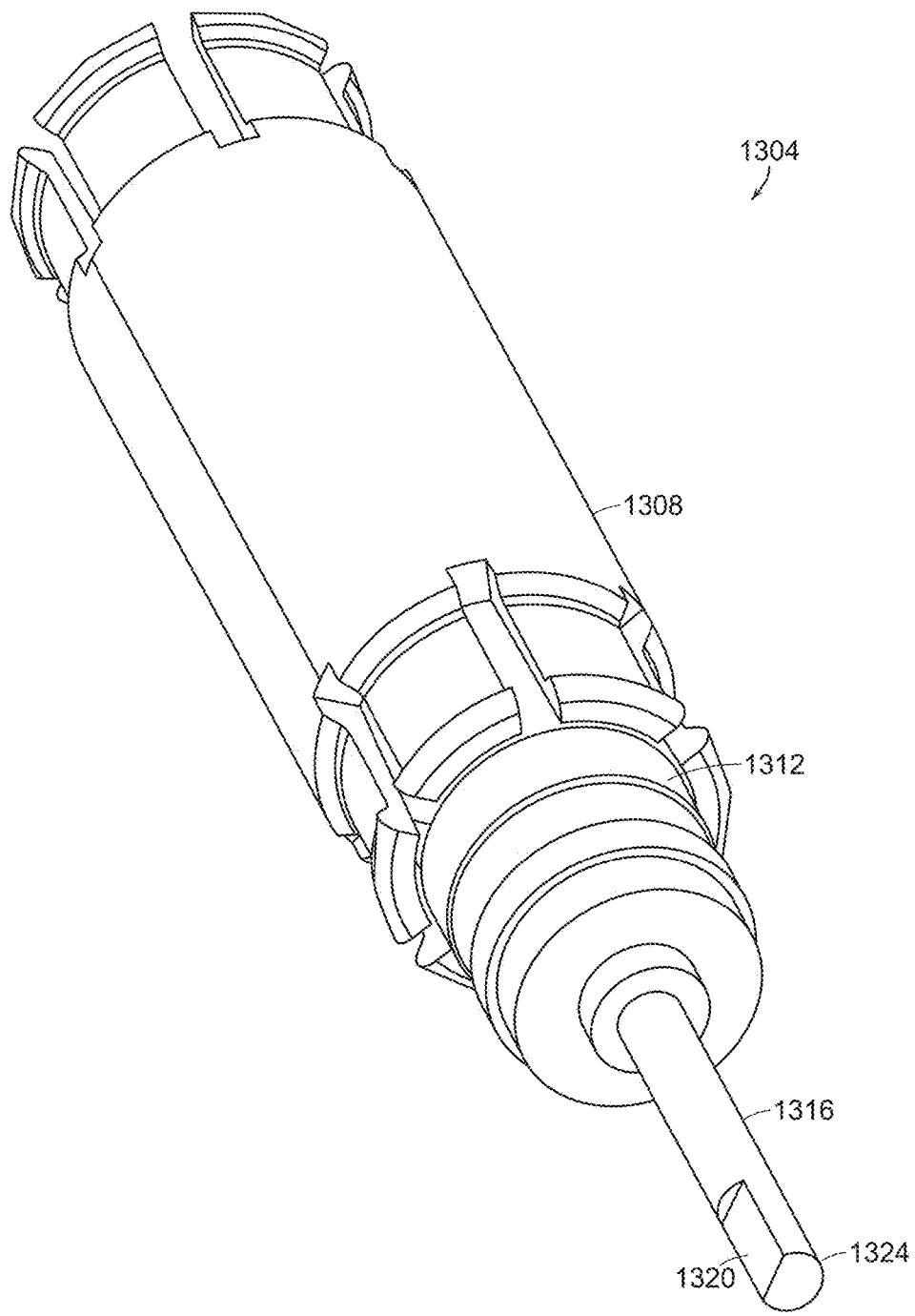
Figures 2, 13:
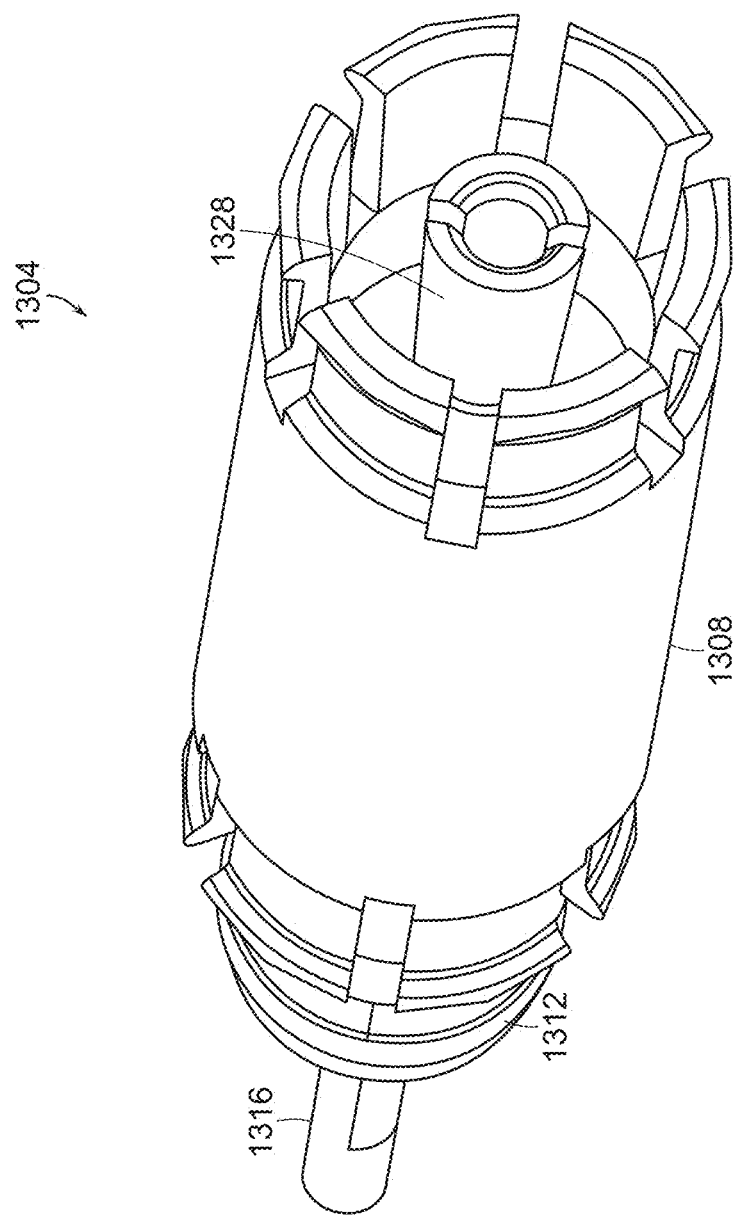
Figure 14:
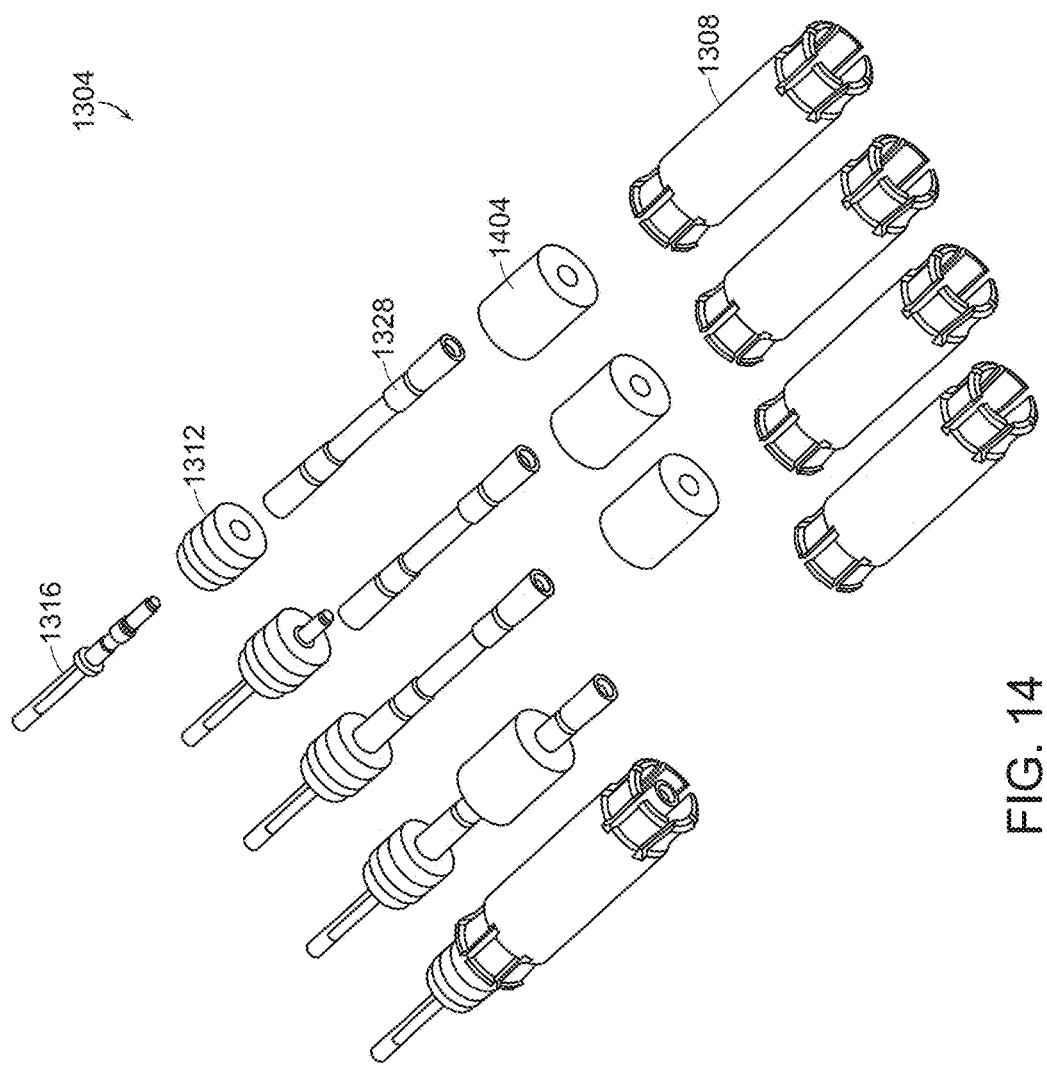
FIG. 14 is an exploded view of the pin assembly of FIGS. 13-1 and 13-2.

Each coaxial pin assembly 1304 as shown in FIGS. 13-1 and 13-2, includes a housing 1308 an external choke 1312 and a contact pin 1316. The coaxial pin assembly may be one manufactured by Micro-Mode Products, Inc. of El Cajon, Calif. The contact pin 1316 is generally cylindrical but is provided with a flattened portion 1320 disposed at a distal end 1324 of the contact pin 1316. At one end of the housing 1308, a coaxial conduit 1328 is accessible as can be seen in FIG. 13-2. An exploded view of the pin assembly 1304 is presented in FIG. 14 including an internal choke 1404.

Figure 15:
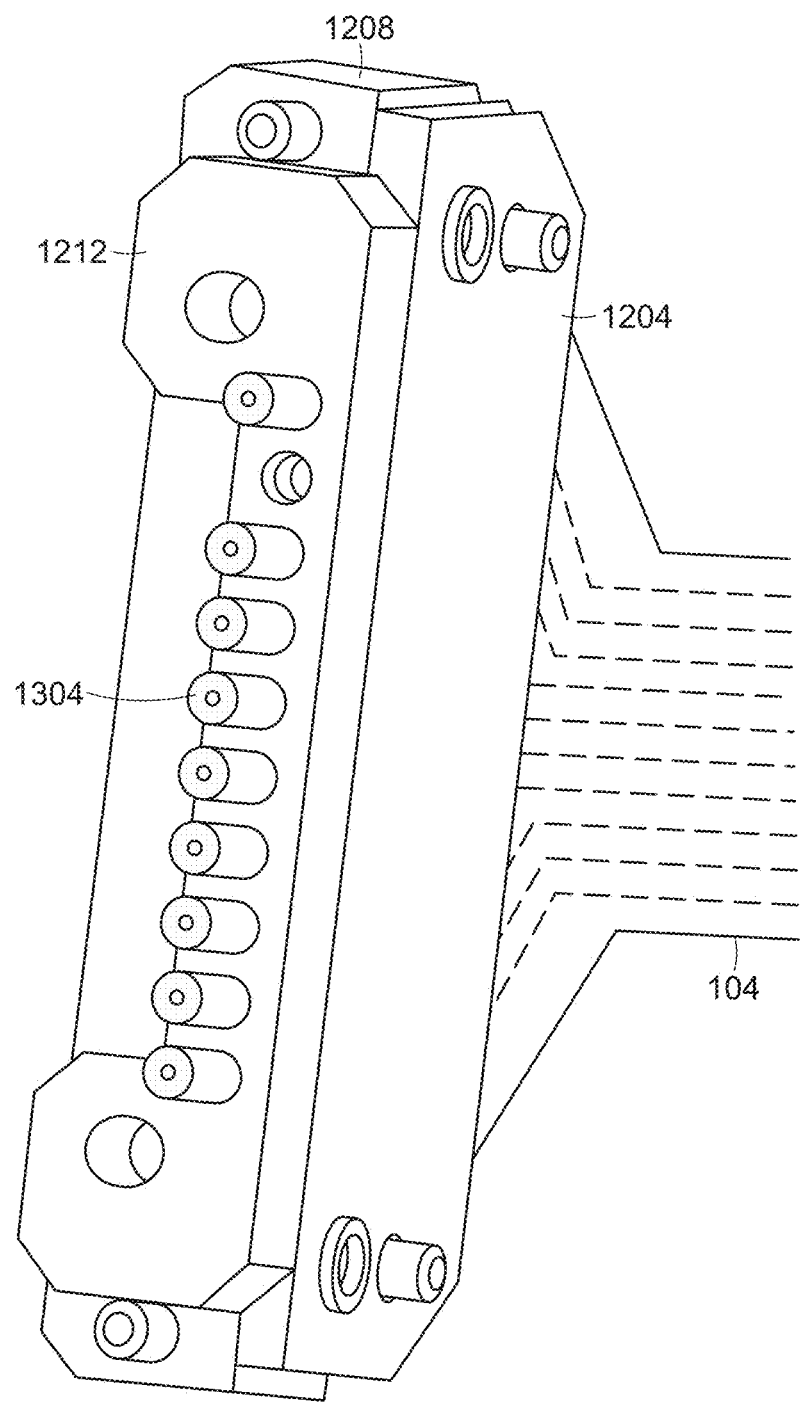
FIG. 15 is a perspective view of the connector disposed in the device of FIG. 1.
Figure 16:
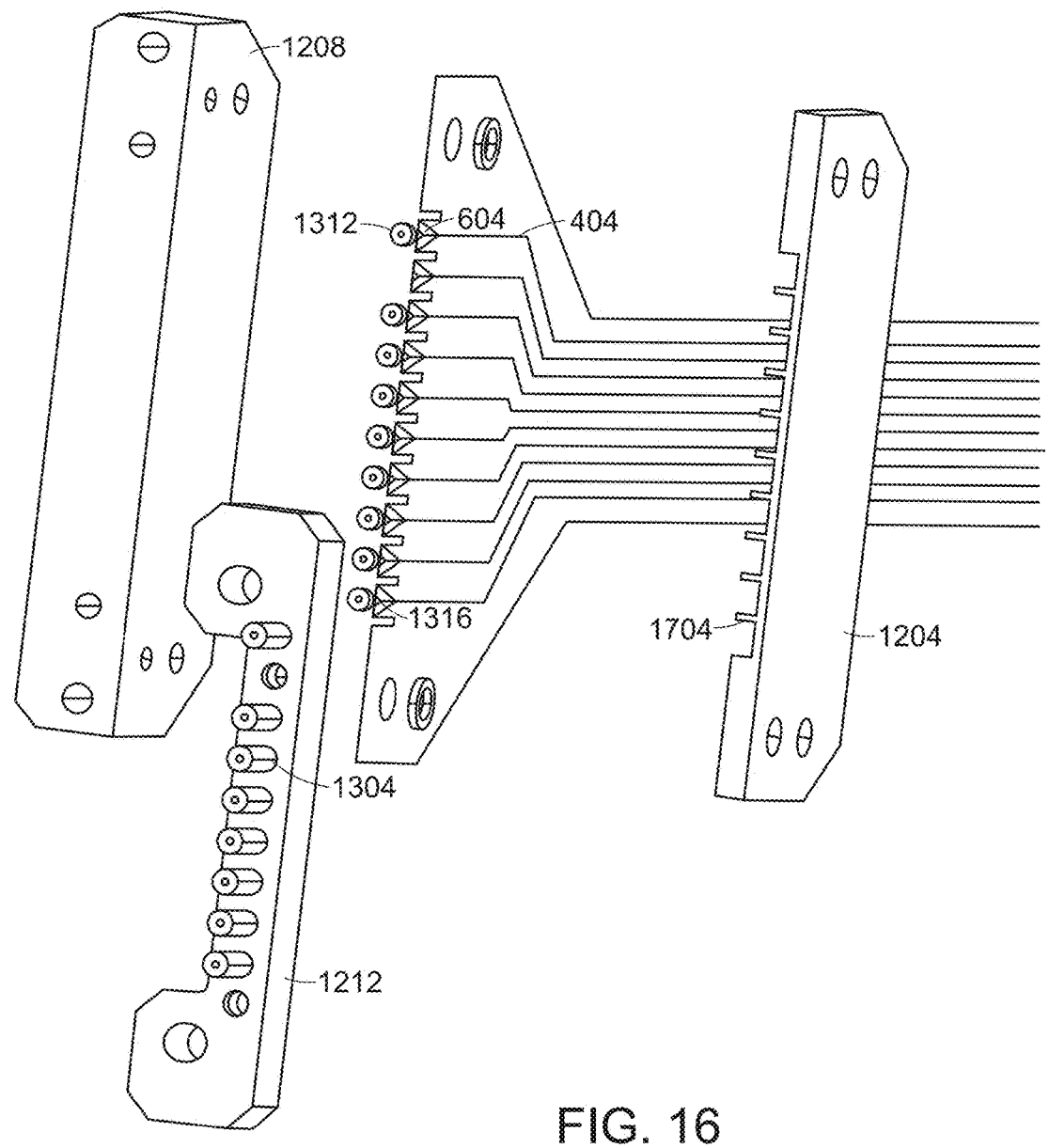
FIG. 16 is an exploded perspective view of the connector as shown in FIG. 15.

As shown in FIGS. 15 and 16, the connector 108 couples each pin assembly 1304 to a respective conductive trace 404 by attachment of the contact pin 1316 to a respective trace launch 604. In addition, the upper shell 1204 is shaped to provide effective isolation of signals between traces 404.

Figure 17:
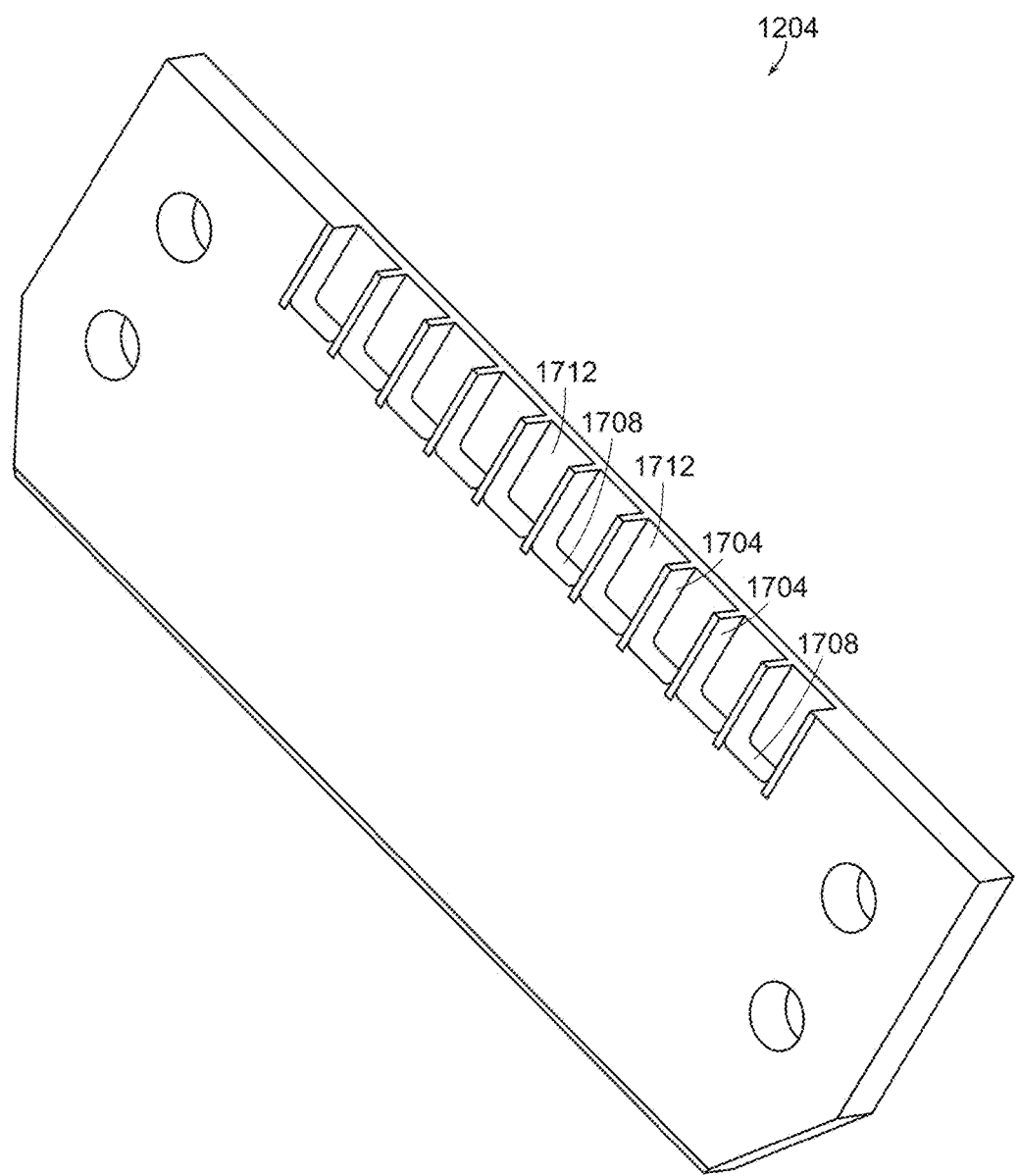
FIG. 17 is a perspective view of the upper shell portion of the connector.
Figure 18:
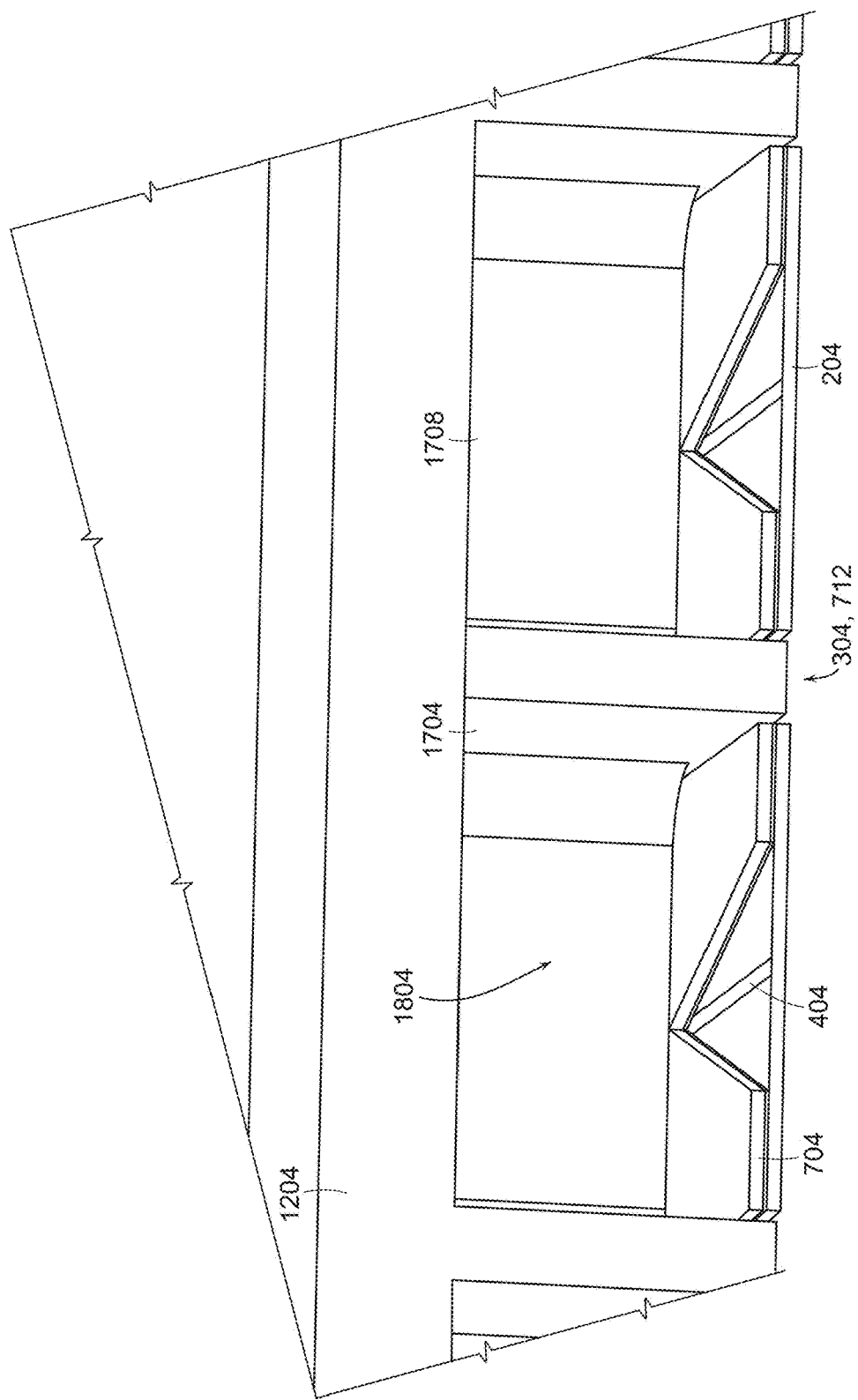
FIG. 18 is a close-up view of the upper shell portion of FIG. 17 coupled to a signal carrying structure in accordance with an aspect of the present invention.

The upper shell 1204 includes a plurality of baffles 1704 and back walls 1708 that define a cavity 1712 as shown in FIG. 17. When the connector 108 is coupled to the signal carrying structure 104, as shown in FIG. 18, the baffles 1704 line up with the slots 304, 712 defined in the first and second dielectric substrates 204, 704 to define an isolating chamber 1804 between the slots 304, 712 and the apex 1004 where the trace 404 is covered by the second dielectric substrate 704.

Figure 19:
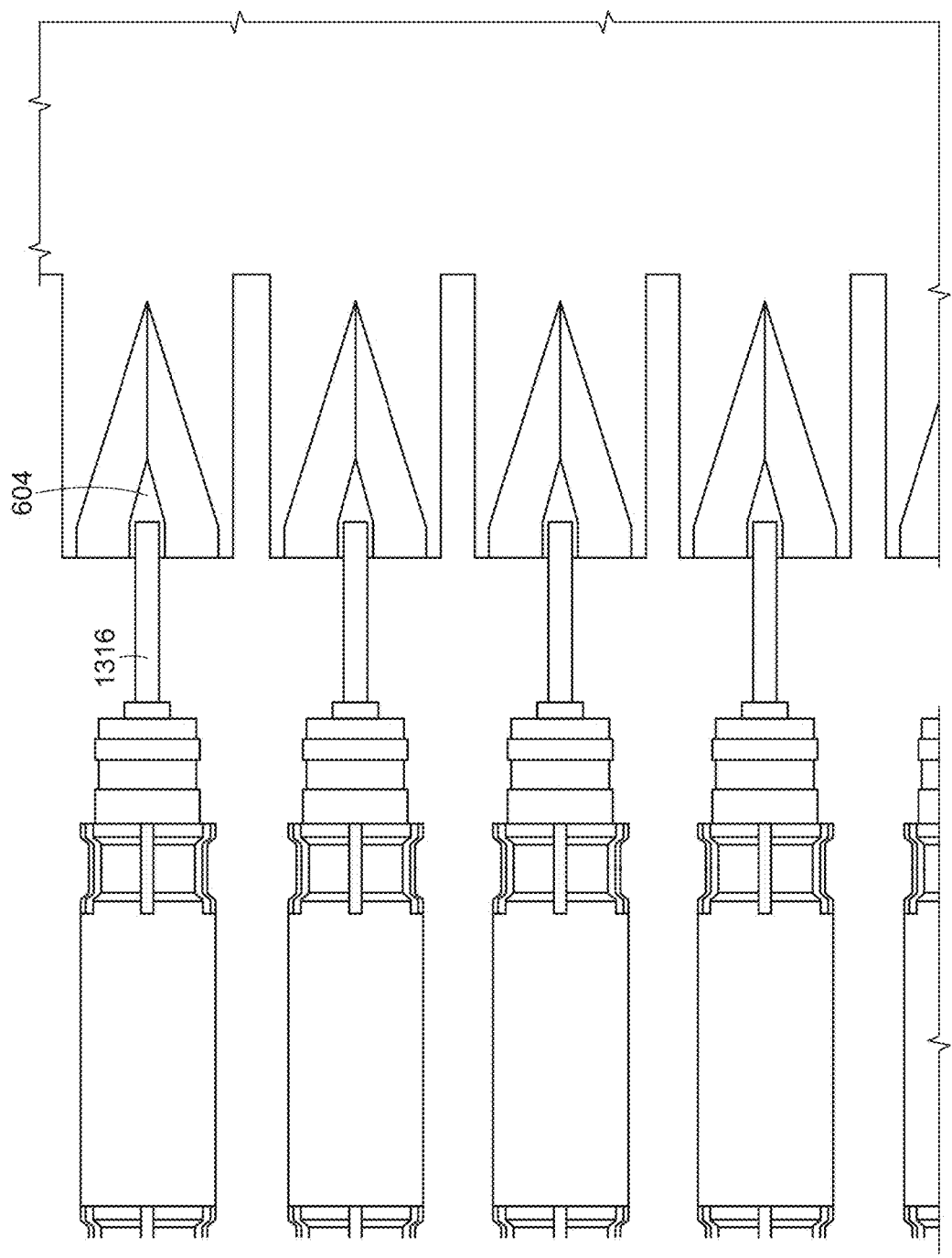
FIG. 19 is a representation of the contact pin coupled to the trace launch in accordance with an aspect of the present disclosure.
Figure 20:
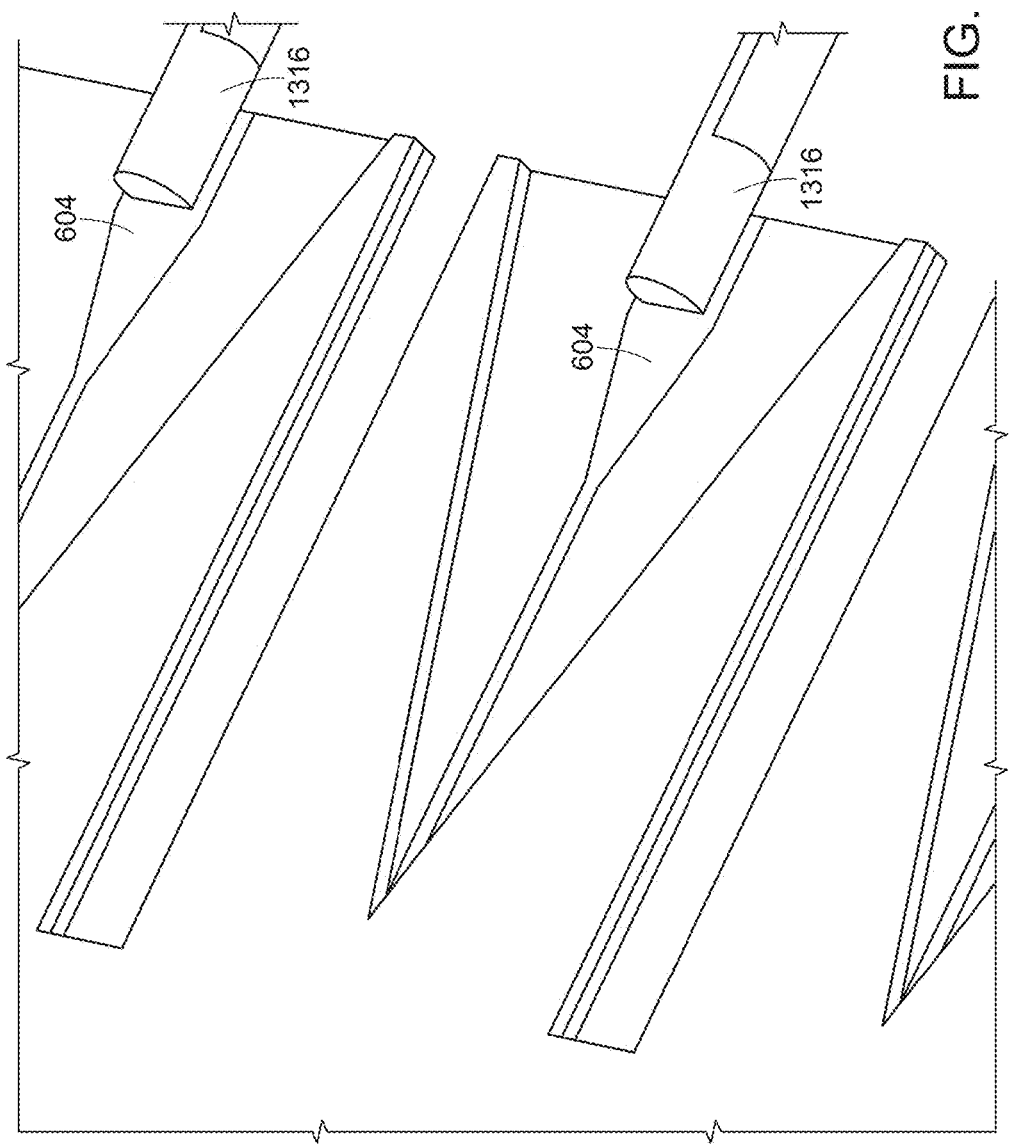
FIG. 20 is a representation of the contact pin coupled to the trace launch in accordance with an aspect of the present disclosure.

Referring to FIGS. 19 and 20, the flat portion 1320 of each contact pin 1316 is attached to a respective trace launch 604. Generally, the flat portion 1320 of each contact pin 1316 is arranged to extend a same predetermined distance onto the respective trace launch 604. In one aspect of the present disclosure, the contact pin 1316 is coupled to the trace launch 604 with conductive epoxy.

The conductive traces 404 run from a respective trace launch 604 at the first end 208 to a respective trace launch 604 at the second end 212. Referring back to FIGS. 5 and 6, representations of the ends 208, 312, the traces 404 run in parallel with one another for a same distance S in a range of 0.595 in to 0.605 in, nominally 0.600 in. At the end of that distance S, each trace 404 slopes at an angle β of 45° away from the outer edges such that all traces 404 converge in parallel to one another and maintain a distance or spacing T between the traces 404. It should be noted that those traces 404 toward the center of the group begin their respective parallel runs before the outer ones do. Advantageously, by having each trace 404 run in parallel for the distance S from the trace launch 604, the impedance of the traces 404 can be made the same.

Generally, the spacing C between centers of trace launches 604 is greater than the spacing T of 0.0320±0.0002 between traces 404 at that portion of the device 100 where the traces 404 are running in parallel to one another.

Advantageously, the device 100 provides a reduced parasitic thermal load by reducing the cable width from a point 412-1 to a point 412-2, as shown in FIG. 4. This reduction in the cross-sectional area to a minimum amount. The ends are larger in order to accommodate the connection structure.

The present disclosure is illustratively described above in reference to the disclosed implementations. Various modifications and changes may be made to the disclosed implementations by persons skilled in the art without departing from the scope of the present disclosure as defined in the appended claims.

What is claimed is:

1. An RF signal interconnect device, comprising:
a first dielectric substrate having a first surface and a second surface and first and second ends;
a plurality of conductive traces provided on the first surface of the first dielectric substrate, each trace having first and second ends, wherein each of the first and second ends has a predetermined shape;
a second dielectric substrate disposed on the first surface of the first dielectric substrate, the second dielectric substrate having first and second ends respectively aligned with the first and second ends of the first substrate, wherein the second dielectric substrate is configured so as not to cover the first and second ends of the conductive traces, whereby the first and second ends of the traces are exposed;
a first connector coupled to the first ends of the first and second dielectric substrates;
a first plurality of conductive pin assemblies disposed in the first connector, each conductive pin assembly coupled to a respective first end of a conductive trace where the conductive trace is not covered by the second dielectric substrate,
wherein the first connector is configured to define a respective isolating chamber about each of the first ends of the conductive traces.

2. The device of claim 1, wherein:
an adhesive is provided between the first and second dielectric substrates.

3. The device of claim 1, wherein each of the first and second dielectric substrates comprises polyimide.

4. The device of claim 1, wherein the first connector comprises a plurality of dividing walls to define each isolating chamber.

5. The device of claim 1, wherein each of the first and second ends of the conductive traces comprises a section exposing the first surface of the first dielectric substrate.

6. The device of claim 5, wherein a portion of the second dielectric that exposes the first and second ends of the conductive traces comprises a generally V-shaped notch.

7. The device of claim 6, wherein an apex of the V-shaped notch is rounded.

8. The device of claim 1, further comprising:
a first protective layer provided on the second dielectric substrate; and
a second protective layer provided on the second surface of the first dielectric substrate,
wherein each of the first and second protection layers comprises one of: a niobium film or copper foil.

9. The device of claim 8, wherein the first protective layer does not cover the second dielectric substrate where the first and second ends of the conductive traces are accessible.

10. The device of claim 1, wherein each conductive trace comprises one of: Niobium, Niobium-Titanium Alloy, Niobium-Germanium Alloy, Niobium-Tin Alloy, Tantalum or Magnesium Diboride.

11. The device of claim 10, wherein each conductive trace is provided on the first surface of the first dielectric substrate by sputtering.

12. An RF signal interconnect device, comprising:
a signal carrying structure, comprising:
a first dielectric substrate having a first surface and a second surface;
a plurality of conductive traces provided on the first surface of the first dielectric substrate, each trace having first and second ends, wherein each of the first and second ends has a predetermined shape; and
a second dielectric substrate disposed on the first surface of the first dielectric substrate,
wherein the second dielectric substrate is configured so as not to cover the first and second ends of the conductive traces, whereby the first and second ends of the traces are exposed; and
a first connector, coupled to the signal carrying structure, comprising:
an upper shell portion;
a plurality of dividing walls provided in the upper shell portion and defining a plurality of cavities; and
a first plurality of conductive pin assemblies, each pin assembly arranged in a respective upper shell portion cavity and coupled to a respective first end of a conductive trace where the conductive trace remains exposed through the second dielectric substrate,
whereby a respective isolating chamber about the first ends of the conductive traces is provided.

13. The device of claim 12, wherein the signal carrying structure further comprises:
an adhesive provided between the first and second dielectric substrates.

14. The device of claim 12, wherein each of the first and second dielectric substrates comprises polyimide.

15. The device of claim 12, wherein the signal carrying structure further comprises:
a first protective layer provided on the second dielectric substrate; and
a second protective layer provided on the second surface of the first dielectric substrate,
wherein each of the first and second protection layers comprises one of: a niobium film or copper foil.

16. The device of claim 12, wherein each of the first and second ends of the conductive traces comprises a section exposing the first surface of the first dielectric substrate.

17. The device of claim 16, wherein a portion of the second dielectric that exposes the first and second ends of the conductive traces comprises a V-shaped notch.

18. The device of claim 17, wherein an apex of the V-shaped notch is rounded.

19. The device of claim 12, wherein each conductive trace comprises at least one of: Niobium, Niobium-Titanium Alloy, Niobium-Germanium Alloy, Niobium-Tin Alloy, Tantalum or Magnesium Diboride.

20. The device of claim 19, wherein each conductive trace is provided on the first surface of the first dielectric substrate by sputtering.

* * * * *